United States Patent [19]
Ito et al.

[11] Patent Number: 6,072,162
[45] Date of Patent: Jun. 6, 2000

[54] DEVICE AND METHOD FOR HEATING SUBSTRATE, AND METHOD FOR TREATING SUBSTRATE

[75] Inventors: Shinichi Ito; Katsuya Okumura, both of Yokohama, Japan

[73] Assignee: Kabushiki Kaisha Toshiba, Kawasaki, Japan

[21] Appl. No.: 09/352,323

[22] Filed: Jul. 12, 1999

[30] Foreign Application Priority Data

Jul. 13, 1998 [JP] Japan ................................ 10-197465

[51] Int. Cl.$^7$ ........................... H05B 3/68; C23C 16/00
[52] U.S. Cl. .................. 219/444.1; 118/715; 118/725
[58] Field of Search ....................... 219/444.1, 446.1, 219/448.1, 448.12, 121.36, 121.37, 121.38, 121.39, 121.4, 121.41; 118/715, 720, 721, 723 VE, 724, 725, 726, 727; 427/8, 9, 10, 74, 592, 593

[56] References Cited

U.S. PATENT DOCUMENTS

| | | | |
|---|---|---|---|
| 4,332,833 | 6/1982 | Aspnes et al. ........................... 427/8 |
| 5,177,878 | 1/1993 | Visser ...................................... 34/92 |
| 5,226,056 | 7/1993 | Kilkuchi et al. ....................... 373/18 |
| 5,290,381 | 3/1994 | Nozawa et al. ...................... 156/345 |
| 5,294,778 | 3/1994 | Carman et al. .................... 219/444.1 |

Primary Examiner—Sang Paik
Attorney, Agent, or Firm—Finnegan, Henderson, Farabow, Garrett & Dunner, L.L.P.

[57] ABSTRACT

A device for heating a substrate comprises a heating plate for heating a to-be-treated substrate, substrate holding section for holding the to-be-treated substrate on the heating plate, a gas stream producing section for producing a gas stream in a space above the heating plate in one direction along a surface of the heating plate, and a heater provided at the heating plate, and having pattern symmetrical with respect to a gas stream flowing through the center of the heating plate, wherein the heater comprises a first heater constituting section having heater elements arranged in the form of a ring, and a second heater constituting section located inside the first heater constituting section and having heater elements which are arranged so that more heat is generated in an upstream side of the gas stream than in a downstream side thereof.

15 Claims, 7 Drawing Sheets

○ TERMINAL CONNECTING PORTIONS

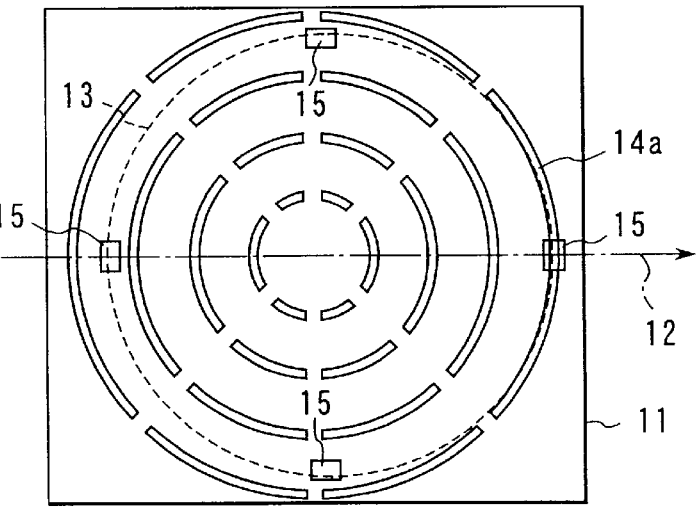
FIG. 14A
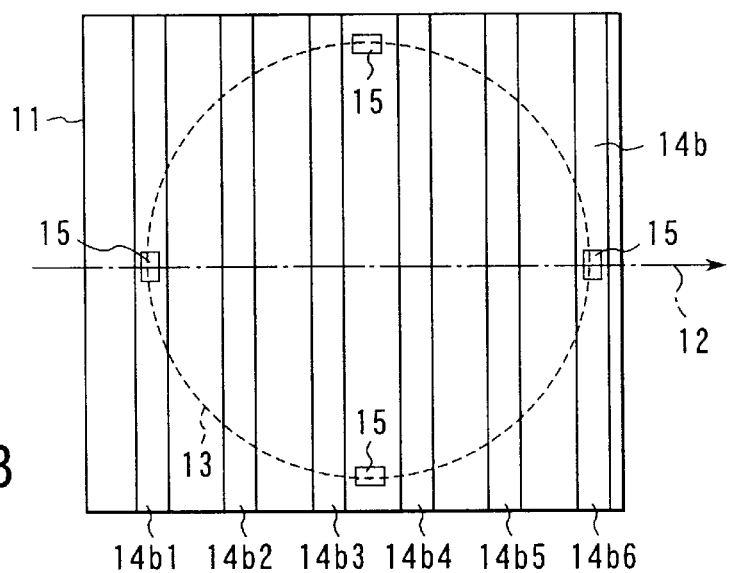
FIG. 14B
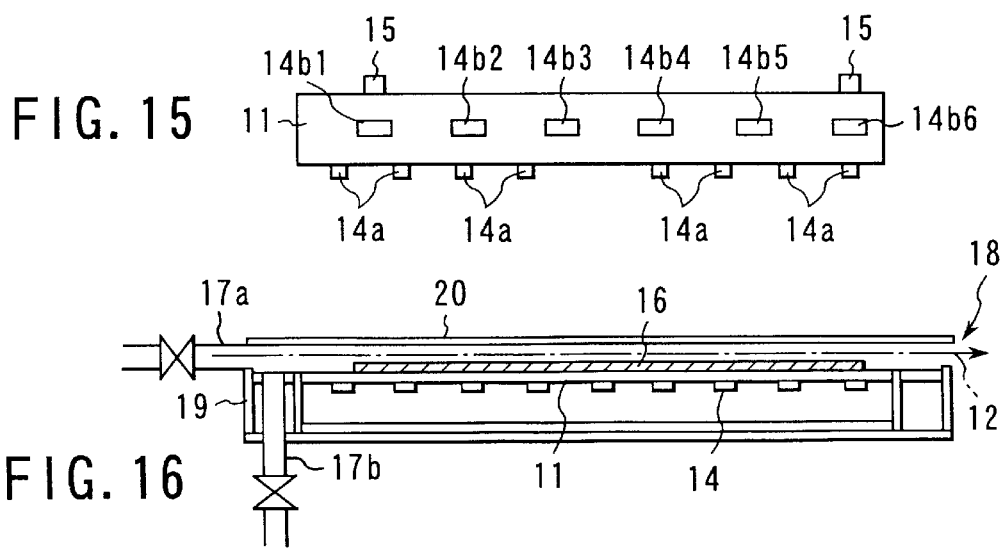
FIG. 15
FIG. 16

1 …

DEVICE AND METHOD FOR HEATING SUBSTRATE, AND METHOD FOR TREATING SUBSTRATE

BACKGROUND OF THE INVENTION

The present invention relates to a device and method for heating a substrate, and a method for treating a substrate.

In a heating device in which a heat treatment of a substrate is performed, it is required for a gas stream to be produced under an upper plate in order to avoid gas or fine particles produced during the heating from deposition on the upper plate. Conventionally, there has widely been used a method in which gas is introduced from the surrounding area of a to-be-treated substrate and discharged upwardly through the middle portion of the upper plate. In this method, however, there arises a problem that a device is thick as a whole.

Further, in a conventional heating device, a heat diffusion plate for transmitting heat of a heater to a to-be-treated substrate is provided in a lower housing equipped with the heater and uniform heating on the surface of the lower housing is realized by making a thickness of the heat diffusion plate as thick as about 15 mm. There arises a problem, however, since while the heating is improved in uniformity when the heat diffusion plate is thick, heating responsibility is deteriorated. In order to improve heating responsibility, it is only required that the heat diffusion plate is thin. However, when the heat diffusion plate is thin, it is hard to realize uniform heating.

Division of a heater has been proposed in order to attain good heating uniformity (for example, see Jpn. Pat. Appln. KOKAI Publication No. 4-239120). In this proposal, however, no consideration is given to an influence of a gas stream under the upper plate. Therefore, good heating uniformity all over a substrate surface is hard to be attained.

Further, some examples have been found in the CVD process from the viewpoint of temperature correction of a gas stream (for example, Jpn. Pat. Appln. KOKAI Publication Nos. 9-237674 and 4-325683). However, these examples are proposed for realization of a uniform reaction of a raw material gas above a to-be-treated substrate. Accordingly, the teachings are hard to give a solution for good heating uniformity all over a substrate surface.

On the other hand, high precision is required in uniformity of heat supply to a substrate in a heating step after a chemical amplified type resist coated on a substrate is subjected to exposure. When a chemical amplified type resist is used, an acid diffusion reaction which occurs in a heating step progresses at a low speed even in room temperature immediately after the exposure. In a conventional heating method, such a problem as occur by an acid diffusion reaction has not been able to be solved.

As mentioned above, in a conventional heating device, it has been hard to attain good heating uniformity all over a substrate surface. Further, conventionally, it has also been hard to solve a problem occurring by an acid diffusion reaction after resist coating.

BRIEF SUMMARY OF THE INVENTION

The present invention has been made to solve the above described conventional problems. Accordingly, it is a first object of the present invention to provide a device and method for heating a substrate in which a high degree of heating uniformity all over a substrate surface can be attained. It is a second object of the present invention to provide a method for treating a substrate by which a problem occurring by an acid diffusion reaction after resist coating can be solved.

A device for heating a substrate according to a first aspect of the present invention comprises: a heating plate for heating a to-be-treated substrate; a substrate holding section for holding the to-be-treated substrate on the heating plate; a gas stream producing section for producing a gas stream in a space above the heating plate in one direction along a surface of the heating plate; and a heater provided at the heating plate, and having pattern symmetrical with respect to a gas stream flowing through the center of the heating plate. The heater comprises: a first heater constituting section having heater elements arranged in the form of a ring; and a second heater constituting section located inside the first heater constituting section and having heater elements which are arranged so that more heat is generated in an upstream side of the gas stream than in a downstream side thereof.

A device for heating a substrate according to a second aspect of the present invention comprises: a heating plate for heating a to-be-treated substrate; a substrate holding section for holding the to-be-treated substrate on the heating plate; a gas stream producing section for producing a gas stream in a space above the heating plate in one direction along a surface of the heating plate; and a heater provided at the heating plate, and having pattern symmetrical with respect to a gas stream flowing through the center of the heating plate. The heater comprises: a first heater constituting section having heater elements arranged in the form of a ring, (wherein the heater elements are arranged from the inside to the outside); and a second heater constituting section having heater elements arranged from the upstream side to the downstream side.

The term "in the form of a ring" means any of patterns including not only a closed ring but a partitioned ring. Further, a ring is not necessarily of a circle, but may be of an ellipse, a polygon such as a tetragon, or the like.

When a to-be-treated substrate is heated by a heating plate, heat dissipation is more in a substrate peripheral portion than in a substrate central portion. Consequently, a temperature is easier to be reduced in the substrate peripheral portion than in the substrate central portion. Further, when a gas stream in a space above the heating plate is formed in a laminated manner along the surface of the heating plate, a substrate temperature is easier to be reduced in the upstream side than in the downstream side.

According to the present invention, reduction in temperature in the peripheral portion of a substrate caused by heat dissipation there can mainly be corrected by the first heater constituting section. Further, a temperature distribution in a gas steam direction can mainly be corrected by the second heater constituting section, wherein generated heat is larger in the upstream side from the center of the to-be-treated substrate (or the center of the heating plate) than in the downstream side therefrom. Therefore, good heating uniformity can be attained all over the surface of the to-be-treated substrate. Accordingly, for example, a photosensitive film formed on the surface of the to-be-treated substrate can be heated in a uniform manner.

In the mean time, pattern arrangements in the first and second heater constituting sections are preferably symmetrical with respect to a gas stream flowing through the center of the heating plate. Further, a pattern of the first heater constituting section preferably assumes a shape corresponding to that of a plane view of the to-be-treated substrate. For example, it is preferred that when the to-be-treated substrate is of a circle, the first heater constituting section is of a circular ring-like pattern and when the to-be-treated substrate is of a tetragon, the first heater constituting section is of a tetragonal ring-like pattern. Further, the heating plate, too, is preferably of a shape of a plane view corresponding to a plane view of the to-be-treated substrate.

It is preferred to use means for introducing a gas and/or means for discharging a gas in order to form a gas stream in a space above the heating plate in a laminated manner along the surface of the heating plate.

In the first aspect of the present invention, there are below shown examples in which the second heater constituting section is constructed so that more heat is generated in the upstream side than in the downstream side:

(a) The number of patterns of heater elements is larger in the upstream side than in the downstream side.

(b) A pattern area of heater elements in the upstream side is larger than in the downstream side.

(c) Values of resistance of heater elements in the upstream side are larger than those in the downstream side. In other words, a pattern width of the heater element in the upstream side is smaller than that in the downstream side.

In the first and second aspects of the present invention, the substrate holding section is preferably constituted so that the center of a to-be-treated substrate held on the heating plate is located in the downstream side from the center of the first heater constituting section.

Since heat is transferred from the upstream side to the downstream side under influence of a gas stream, a higher degree of heating uniformity is achieved by locating the center of a to-be-treated substrate in the downstream side.

In the first and second aspects of the present invention, the device for heating a substrate has a plurality of pins for moving a to-be-treated substrate in vertical direction, and the plurality of pins are preferably arranged symmetrically with respect to a gas stream flowing through the center of the heating plate.

A first method for heating a substrate according to the present invention uses a device for heating a substrate according to the first and second aspects of the present invention and a to-be-treated substrate held on the heating plate is heated so that a temperature of the heating plate which is heated by the heater is lower in the downstream side than in the upstream side.

Heat is transferred from the upstream side to the downstream side under influence of a gas stream. A temperature of the heating plate can be lower in the downstream side than in the upstream side by making generated heat in the upstream side of the heater more than in the downstream side thereof. With this adjustment, a higher degree of heating uniformity can be achieved. For example, a temperature of a heating plate is set higher than a temperature of the to-be-treated substrate to be set at in the upstream side from the center of a to-be-treated substrate, while a temperature of the heating plate is set to a temperature equal to or lower than a temperature of the to-be-treated substrate to be set at in the downstream side from the center of the to-be-treated substrate.

A second method for heating a substrate according to the present invention uses a device for heating a substrate according to the first and second aspects of the present invention and a temperature of the heating plate which is heated by the heater is controlled so that a temperature of the heating plate is a predetermined temperature higher than a treatment temperature of a to-be-treated substrate before the to-be-treated substrate is placed on the heating plate and that a temperature of the heating plate is lower than the predetermined temperature after the to-be-treated substrate is placed on the heating plate.

In such a manner, a temperature of a to-be-treated substrate can be made to reach a desired temperature in a short time by setting a temperature of the heating plate higher in advance.

In the first and second methods for heating a substrate, generated heat of the heater is preferably controlled by a temperature control section based on a measurement result of a temperature measurement section disposed in a space above a to-be-treated substrate. In this case, the temperature measurement section is preferably constructed from a light illumination section which illuminates a surface of a to-be-treated substrate; and a reaction amount measurement section in which a change in reflectance due to a change in film thickness or in absorbance of a surface layer of the to-be-treated substrate is obtained by measuring an intensity of reflecting light from the surface of the to-be-treated substrate and a reaction amount of the surface layer is obtained based on the change in reflectance, and the temperature control section preferably controls generated heat of the heater so that the reaction amount which is obtained in the reaction amount measurement section becomes a predetermined amount.

In such a manner, a temperature of a to-be-treated substrate can correctly be measured by measuring a temperature with the temperature measurement section disposed in a space above the to-be-treated substrate. Therefore, generated heat of a heater can more correctly be controlled and then heating uniformity of the to-be-treated substrate can be higher in degree.

A third method for heating a substrate according to the present invention uses a device for heating a substrate according to the first and second aspects of the present invention and after a to-be-treated substrate held on the heating plate is heated by the heater, the to-be-treated substrate is raised and kept in an inclined state (preferably, in an inclined state of the substrate along a gas stream).

A temperature all over a substrate surface can be reduced in a uniform manner by maintaining a to-be-treated substrate in an inclined state along a gas stream in such a manner.

A method for treating a substrate according to the present invention comprises the steps of: transferring a pattern onto a photosensitive film by exposing the photosensitive film while a to-be-transferred area of the photosensitive film formed on the to-be-treated substrate is moved along a predetermined direction; holding the to-be-treated substrate on the heating plate; and heating the to-be-treated substrate so that a temperature of the to-be-treated substrate held on the heating plate is higher toward a direction along which the to-be-transferred area of the photosensitive film is moved.

In the method for treating a substrate, the step of heating the to-be-treated substrate so that a temperature of the to-be-treated substrate held on the heating plate is higher toward the direction along which the to-be-transferred area of the photosensitive film is moved is preferably performed by producing a gas stream in a space above the to-be-treated substrate toward the direction along which the to-be-transferred area of the photosensitive film is moved, while the heating plate is heated.

In the method for treating a substrate, the step of heating the to-be-treated substrate so that a temperature of the to-be-treated substrate held on the heating plate is higher toward the direction along which the to-be-transferred area of the photosensitive film is moved is preferably performed by heating the heating plate so that a temperature of the heating plate is higher toward the direction along which the to-be-transferred area of the photosensitive film is moved.

When as a photosensitive film, for example, a chemical amplified type resist is used, an acid diffusion reaction, that is a dark reaction, progresses immediately after exposure even at room temperature. Therefore, in the present invention, a to-be-treated substrate held on a heating plate is heated so that a temperature of the to-be-treated substrate is increased in a corresponding manner to a direction along which a to-be-transferred area of the photosensitive film is moved. Thereby, an error caused by an acid diffusion reaction can be corrected and dimensional controllability of a pattern on a photosensitive film after development can in turn be improved.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 14A and 14B are views mainly showing another example of a heater structure of a device for heating a substrate;

FIG. 15 is a view showing a sectional structure of FIGS. 14A and 14B; and

FIG. 16 is a view showing another example of a body structure of a device for heating a substrate.

DETAILED DESCRIPTION OF THE INVENTION (Embodiment 1)

Figure 1:
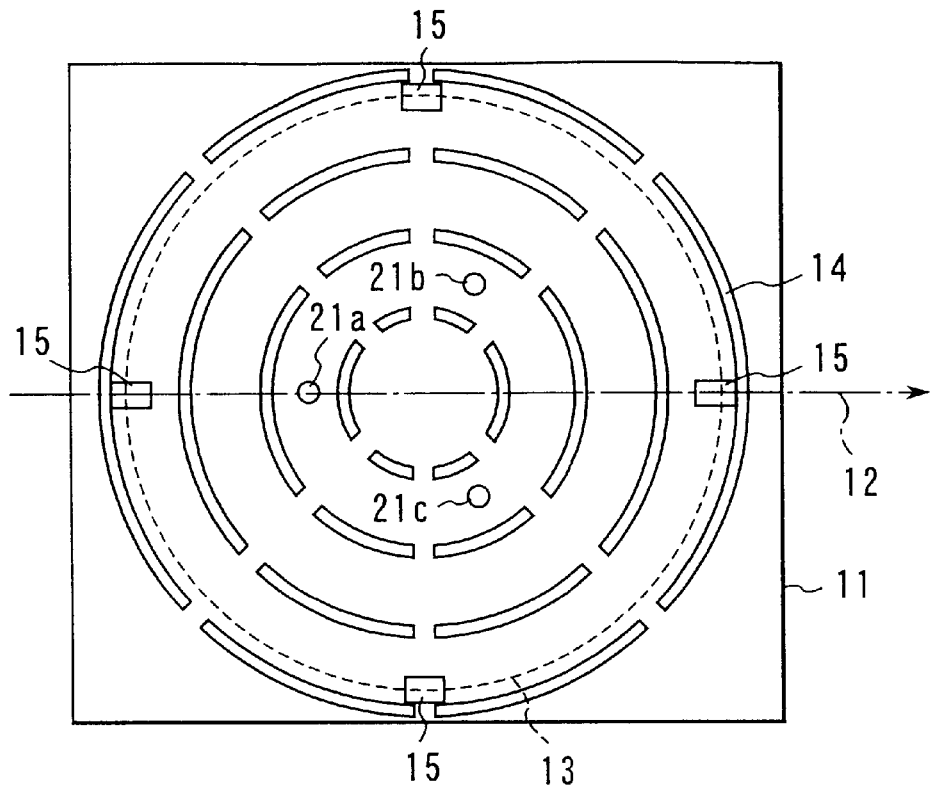
FIG. 1 is a view mainly showing an example of a heater structure of a device for heating a substrate.

FIG. 1 is a top view mainly showing a heater structure of a device for heating a substrate according to the embodiment.

A to-be-treated substrate (in this case, a silicon wafer of a heat capacity of 55.9J/K is used as the to-be-treated substrate) is fixedly held in a substrate placement area 13 on a heat diffusion plate 11 by a plurality of substrate holding pins 15. The heat diffusion plate 11 in use is made of a high heat conductivity material. In this case, the heat diffusion plate 11 in use is made of AlN (heat conductivity of 180 W/msK) and has a thickness of 3 mm (heat capacity of 248.7J/K).

A plurality of heater elements constituting a heater 14 are formed on the bottom surface of the heat diffusion plate 11 by a printing technique (In FIG. 1 and several other Figures, arrangement area of the heater elements is illustrated as the heater 14.). A pattern arrangement of the heater elements constituting the heater 14 is in axial symmetry with respect to a gas stream 12 flowing through the center of the heat diffusion plate 11 (the center of the heater 14). Further, the heater elements are concentrically arranged and six heater elements are respectively formed on concentric circles. In the mean time, actually, the number of heater elements is preferably more than as shown in the figure. Further, the heater 14 may be included in the bulk of the heat diffusion plate 11.

Three pins 21a to 21c for vertical movement which are used for moving a to-be-treated substrate upward or downward are arranged in axial symmetry with respect to the central axis 12 of the gas stream.

In the example of FIG. 1, the center of the placement area 13 for a to-be-treated substrate almost coincides with the center of the heater 14. When a gas stream flows at a relative small speed (less than 10 cm/sec), the centers of both almost coincide with each other in such a manner.

Figure 2:
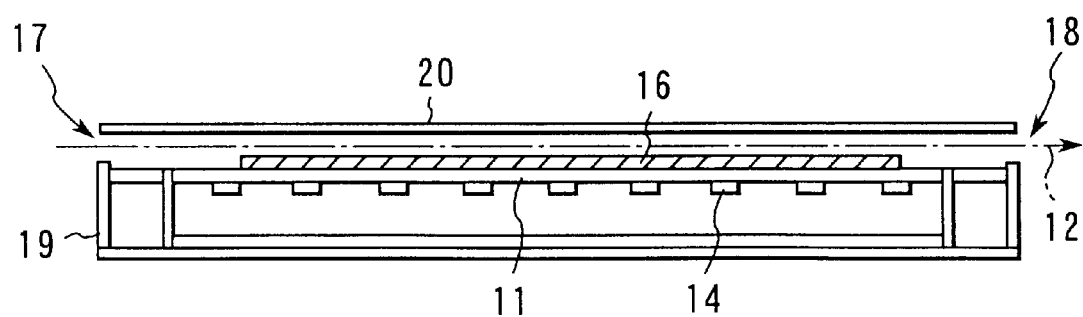
FIG. 2 is a view showing an example of a body structure of a device for heating a substrate.

The number of heater elements along a circumference of each concentric circle was increased compared with those shown in FIG. 1 and a body of a heating device as shown in FIG. 2 was constructed. A frame 19 of the device was fabricated using SUS. A laminar gas stream 12 was produced in a space above a to-be-treated substrate 16 by discharging the gas which flows in through a gas introductory port 17 through a gas exhaust port 18.

Figure 3:
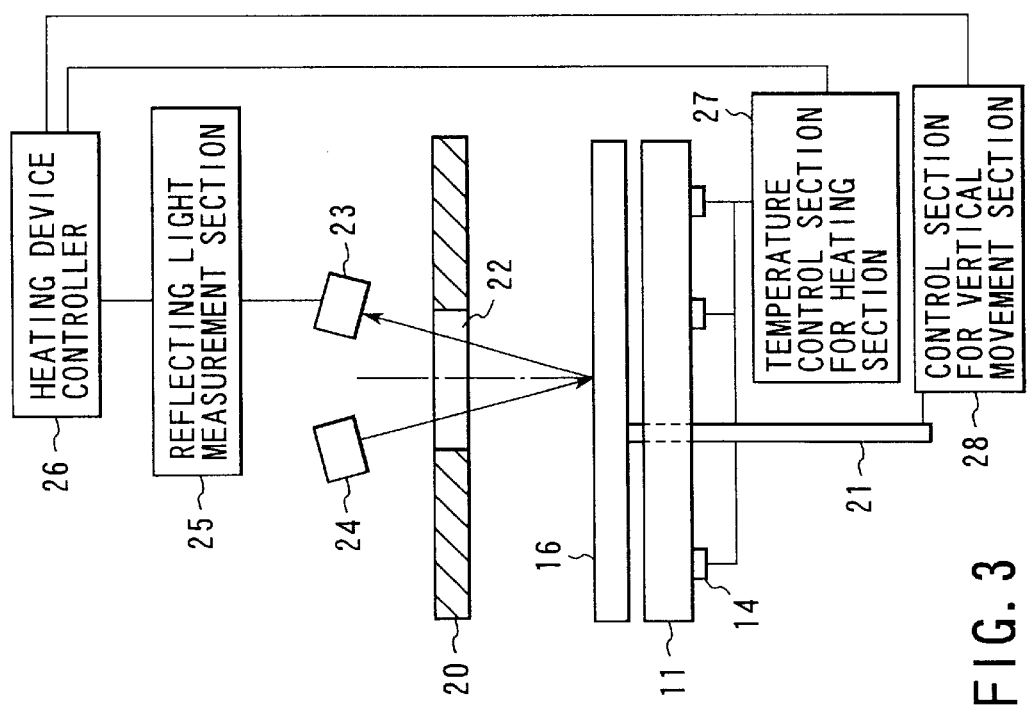
FIG. 3 is a view showing an example of an overall structure of a device for heating a substrate.

FIG. 3 shows an overall structure of a device for heating a substrate.

A lower housing of the body of a heating device is equipped with a vertical movement mechanism 21 for placement of the to-be-treated substrate 16 on the heat diffusion plate 11. An upper plate 20 of the heating device body is provided with a window 22 made of quartz for measurement of a surface temperature of the to-be-treated substrate 16. The to-be-treated substrate 16 (a photosensitive film is formed on the surface thereof) is illuminated with visible light or ultraviolet light from a light source 24 through the window 22. An intensity of reflecting light from the to-be-treated substrate 16 is measured by a reflectance measurement terminal 23 and a signal from the reflectance measurement terminal 23 is sent to a reflecting light measurement section 25. In the reflectance measurement section 25, an reaction amount of the photosensitive film in an light illumination area is attained from a change in reflectance obtained based on a change in thickness or absorbance of the photosensitive film formed on the surface of the to-be-treated substrate.

A heating device controller 26 analyzes a heating condition based on a reaction amount obtained in the reflecting light measurement section 25. A instruction information is sent to a temperature control section 27 for a heating section from the heating device controller 26 based on an analysis result. The temperature control section 27 for a heating section controls each of heater elements of the heater 14 to generates heat based on the instruction information. At this point, generated heat of the heater 14 is adjusted so that a reaction amount obtained in the reflecting light measurement section 25 is a predetermined value. Adjustment of the generated heat is carried out by adjusting ON/OF times of a switch connected to each of the heater elements while a voltage and a current are fixed constant in magnitude.

More of heat is taken away from the to-be-treated substrate in the upstream side than in the downstream side by an influence of a gas stream. Therefore, generated heat of the heater is preferably set to be more in the upstream side than in the downstream side. Further, when a surface temperature of the to-be-treated substrate 16 is higher than a set temperature, the to-be-treated substrate 16 can be moved upward so as to be moved away from the heating plate 11 by a control section 28 for a vertical movement section. To the contrary, when a surface temperature of the to-be-treated substrate 16 is lower than a set temperature, the to-be-treated substrate 16 can be moved downward so as to be closer to the heating plate 11 by a control section 28 for a vertical movement section.

Figure 4:
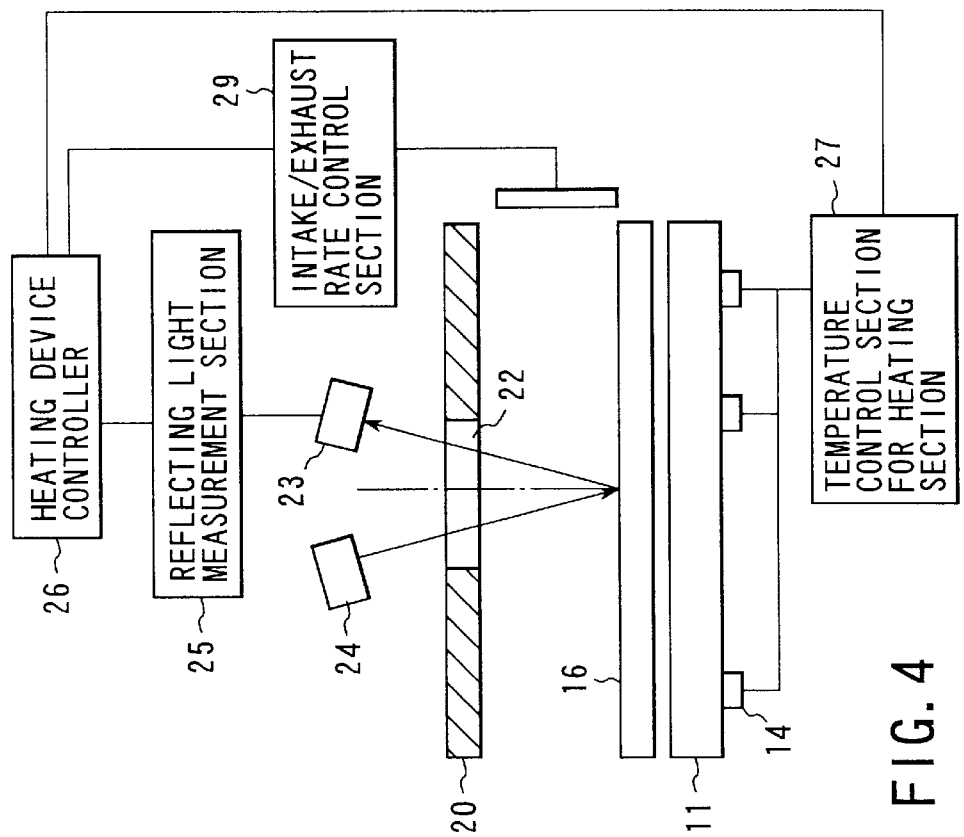
FIG. 4 is a view showing another example of an overall structure of a device for heating a substrate.

In the mean time, as a control method for a surface temperature of a to-be-treated substrate, a method for controlling intake and exhaust gas rates as shown in FIG. 4 may be used. In the method shown in FIG. 4, when a temperature of a to-be-treated substrate is higher than a set temperature, an exhaust gas rate (or an intake gas rate) can increase by an intake/exhaust gas rate control section 29. To the contrary, when a temperature of a to-be-treated substrate is lower than a set temperature, an exhaust gas rate (or an intake gas rate) can decrease by the intake/exhaust gas rate control section 29.

In either of cases where the methods of FIGS. 3 and 4 are used, the heating is suspended at a stage at which a desired reaction amount is achieved.

Then, a concrete example will be described in a case where a to-be-treated substrate is subjected to a heat treatment using the device of the embodiment.

As a to-be-treated substrate, a silicon wafer, on which an anti-reflection film was formed, and which was further coated with a chemical amplified type resist on the anti-reflection film was used. A device pattern with a design rule of a half pitch 150 nm was transferred on such a to-be-treated substrate using a DUV exposure apparatus. After the transfer, a heat treatment at a set treatment temperature of 120° C. was applied to the to-be-treated substrate using the device of the embodiment.

Figure 5:
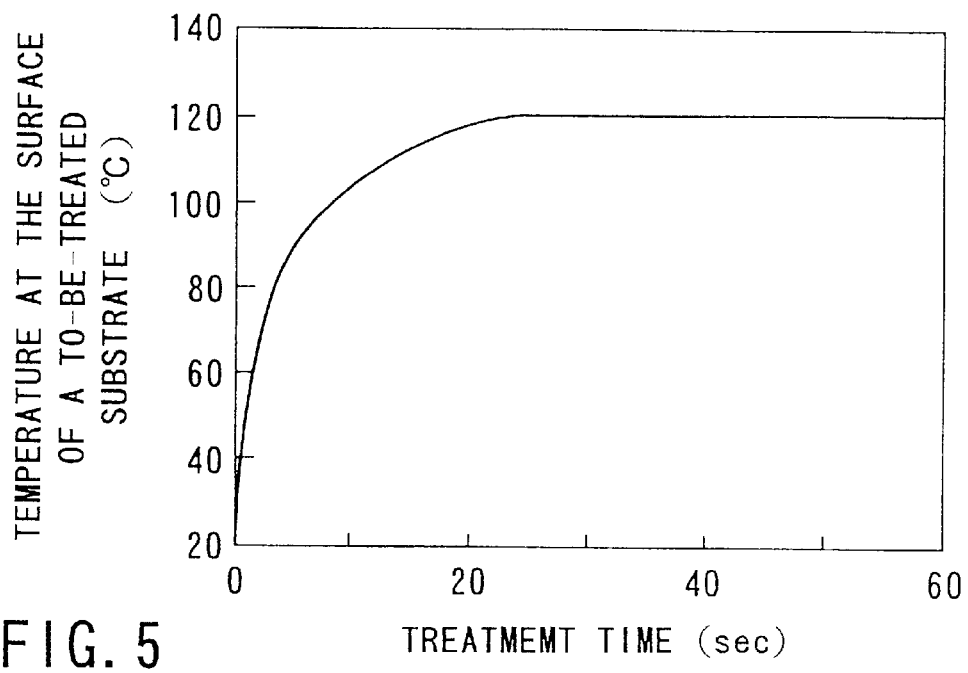
FIG. 5 is a graph showing a change in surface temperature of a silicon wafer with treatment time.

A change in surface temperature with time when a to-be-treated substrate of a surface temperature of 25° C. is placed on the heat diffusion plate is shown in FIG. 5. The to-be-treated substrate reached a set temperature after 20 seconds and then was kept in a stationary state. A variation of a time required to reach the set temperature of 120° C. was within 1 second even for the entire to-be-treated substrate and heating uniformity in the stationary state could be secured within 120° C.±0.2° C. on the entire to-be-treated substrate.

After a heat treatment was carried out for 90 seconds, the to-be-treated substrate was transferred onto a cooling plate. After the to-be-treated substrate was cooled down to room temperature by the cooling plate, development was performed to form a resist pattern. While a size distribution of a resist pattern was of the order of 7% in a conventional heating method, a size distribution of a resist pattern using the device of the embodiment was of the order of 4%. In the mean time, it has been confirmed that a variation of 3% caused by development is included. Accordingly, a size distribution of resist pattern is improved to 2.6% from a conventional 6.3% by using the heating device of the embodiment.

In such a manner, by using the heating device of the embodiment, controllability of a line width in a device could be drastically improved. Since controllability on processing dimension was improved compared with when a conventional device was used, a variation of a resistance was also greatly improved.

Further, when a gas stream speed is low, the center of the placement area 13 for a to-be-treated substrate may almost coincide with the center of the heater 14 as shown in FIG. 1. When a gas stream speed is relative high (roughly equal to or more than 12·cm/sec), the center of the placement area of the to-be-treated substrate 13 is desired to be displaced in the downstream side from the center of the heater 14.

Further, a plan view shape of the heat diffusion plate is not necessarily of a tetragon but may be of a circle.

Figure 7:
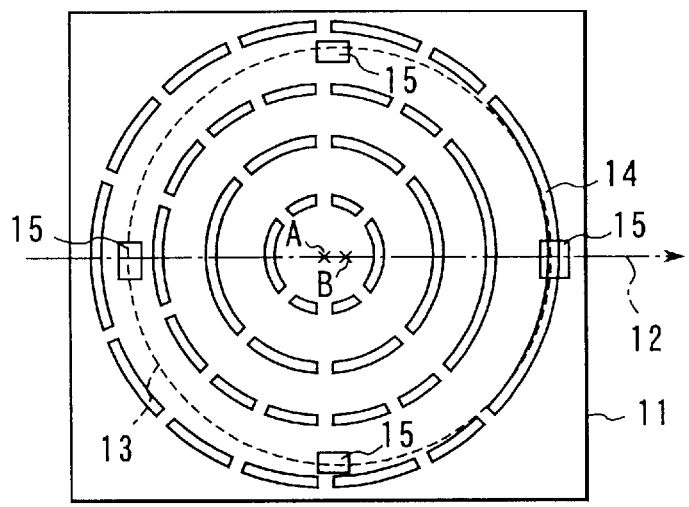
FIG. 7 is a view mainly showing another example of a heater structure of a device for heating a substrate.
Figure 8:
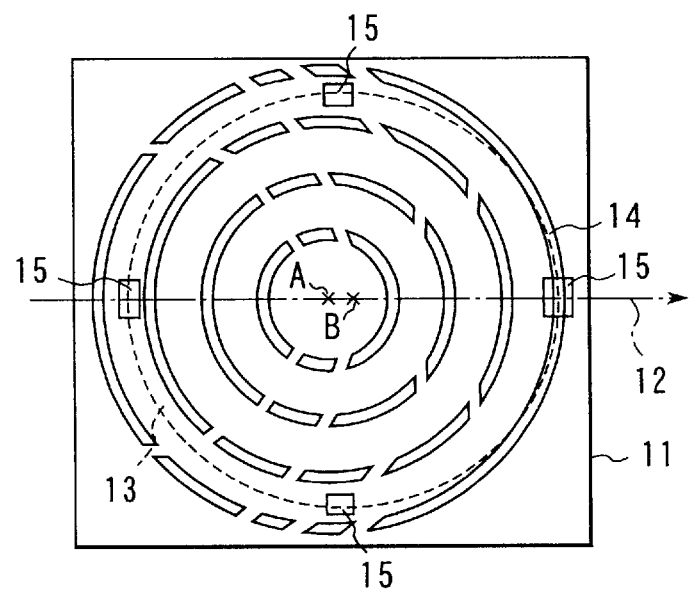
FIG. 8 is a view mainly showing another example of a heater structure of a device for heating a substrate.

A pattern arrangement of a heater 14 may be as shown in FIGS. 7 and 8. FIG. 7 shows to increase the number of divided parts in a heater in the upstream side compared with in the downstream side. With such a pattern arrangement, temperature control in a more finely segmented mode can be realized in the upstream side in which higher precision temperature control is required. Therefore, even when a gas stream speed is high, temperature control can be performed to high precision. Further, when a gas stream speed is high in the central part and slowed toward the outside, as shown in FIG. 8, a pattern arrangement assuming a bow shape corresponding to a gas stream speed in the surface region of the heat diffusion plate may be adopted.

Figure 9:
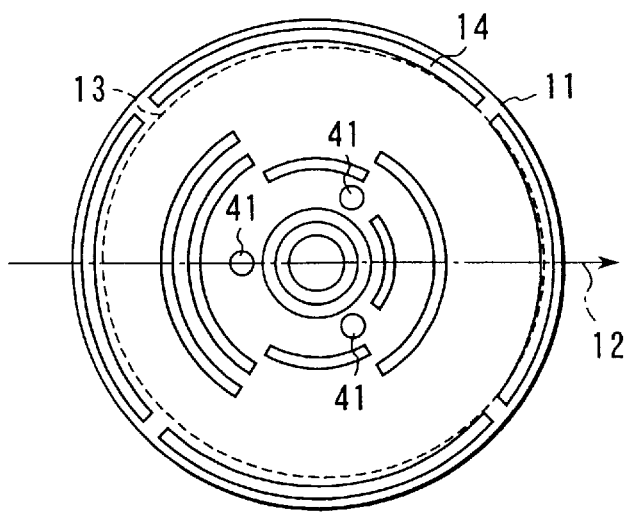
FIG. 9 is a view mainly showing another example of a heater structure of a device for heating a substrate.

FIG. 9 shows still another example of arrangement of the heater 14.

Four ring-like heater elements are arranged in the outermost side of a heater 14 as the first heater constituting section. The ring-like heater elements are to mainly supplement heat dissipation from an edge area of a to-be-treated substrate. Eight heater elements in total are arranged as the second heater constituting section inside the first heater constituting section. As shown in the figure, patterns each of which is part of a ring may be used in the second heater constituting section.

Pattern arrangement of heater elements constituting a heater 14 is in axial symmetry with respect to a gas stream 12 flowing through the center of the heat diffusion plate 11 (the center of the heater 14). Arrangement of three substrate-vertical-movement pins 41 which are used for vertical movement of a to-be-treated substrate is in axial symmetry with respect to a gas stream 12 flowing through the center of the heat diffusion plate 11 (the center of the heater 14). Further, in the upstream section, an arrangement area for heater elements is larger so that generated heat in the upstream section is larger than in the downstream section.

In such a manner, not only are heater elements of a ring-like shape arranged in the outer edge area, but heater arrangement is designed so that generated heat is larger in the upstream side from the center of a substrate than the downstream therefrom in order to compensate heat dissipation in the outer edge area and a heat loss in the upstream side.

Figure 10:
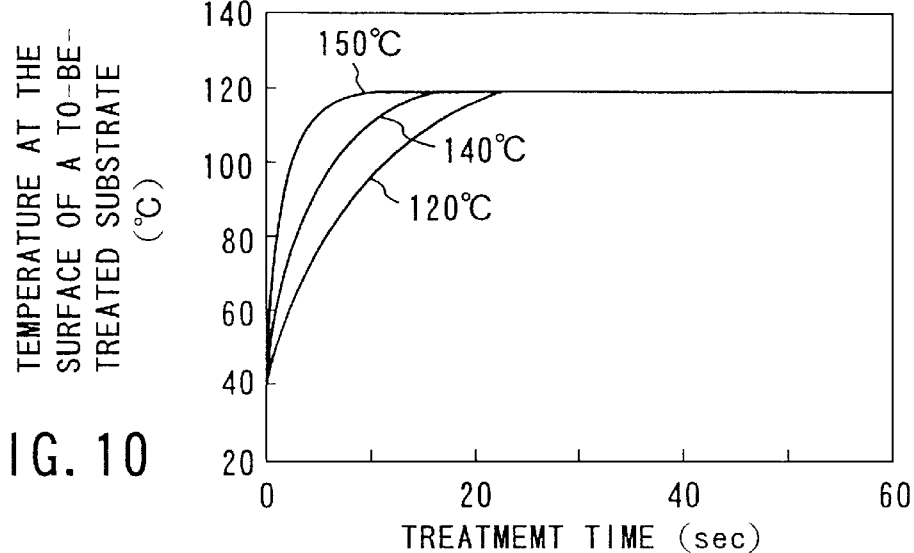
FIG. 10 is a graph showing characteristics of temperature rise of a silicon wafer surface.

Control was performed so that a surface temperature of a to-be-treated substrate is 120° C. at a stage at which the to-be-treated substrate is placed on a heat diffusion plate while the device of the embodiment was used and a temperature of the heat diffusion plate is set at 122° C., in advance, which is a little higher than a treatment temperature of 120° C. of the to-be-treated substrate. As shown in FIG. 10, it took nearly 20 seconds till the surface temperature of the substrate reached 120° C. The cause for this is that since a thickness of the heat diffusion plate is thin, heat which is taken away from the heat diffusion plate cannot instantly be supplemented.

In order to solve this problem, it is preferred to set a temperature of the heat diffusion plate at a temperature a little higher in advance. In a concrete manner, a temperature $T_X$ of the heat diffusion plate is set in the following way:

$$T_X \approx T_S + (t_S \ d_S \ C_S(T_S - T_0))/(t \ d \ C)$$

wherein $T_0$ indicates a temperature of a to-be-treated substrate before placement of the to-be-treated substrate on a heat diffusion plate; $T_S$ indicates a heat treatment temperature of the to-be-treated substrate; $t_S$, $C_S$ and $d_S$ respectively indicate a thickness, a specific heat and a density of the to-be-treated substrate; and t, C, d respectively indicate a thickness, a specific heat and a density of a heat diffusion plate.

If a temperature of the heat diffusion plate is set at $T_X$ in advance, even when a proximity bake (a bake in which a gap between a heat diffusion plate and a to-be-treated substrate is about some hundreds of $\mu$m) is performed, a temperature of the to-be-treated substrate can be brought up to a desired temperature in a short time.

Temperature control at this point in a case where the device of FIG. 3 or 4 is employed is performed including control in which a thermocouple embedded in a heat diffusion plate is used. First, control is performed so that a temperature of the heat diffusion plate is 150° C. based on a measurement value of the thermocouple. Thereafter, a temperature of the heat diffusion plate is controlled to be 120° C. which is a treatment temperature of the to-be-treated substrate at a stage at which the to-be-treated substrate is placed thereon. Then, measurement of a reflectance are started by a reflecting light measurement section or the like. Thereafter, an instruction may be sent to a temperature control section for a heating section according to a reflectance as mentioned above.

In such a manner, a temperature of a heat diffusion plate is set at 150° C. in advance before a to-be-treated substrate is placed on the heat diffusion plate and thereby, as shown in FIG. 10, a temperature of the to-be-treated substrate can quickly be brought up to a desired temperature.

In the mean time, various modifications of or changes in the heater division methods and the number of divided parts in addition to the mentioned above can be made according to a gas speed distribution or the like.

Figure 11:
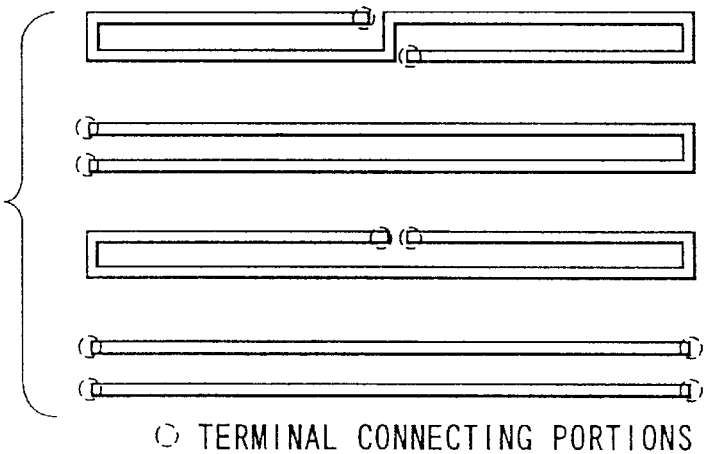
FIG. 11 is a view showing examples of a heater line structure used in a heater.

A variety of heater lines respectively constituting heater elements can be structured in such manners as shown in FIG. 11. That is, there may be a structure in which a heater line is bent in the middle and other points or a structure in which a plurality of heater lines are arranged in parallel to each other. In such cases, patterns of heater lines are not necessarily arranged in axial symmetry with respect to a gas stream flowing through the center of a heat diffusion plate (the center of a heater). However, arrangement of heater elements which are constructed from such heater lines is only required to be in axial symmetry with respect to the central axis.

(Embodiment 2)

Figure 6:
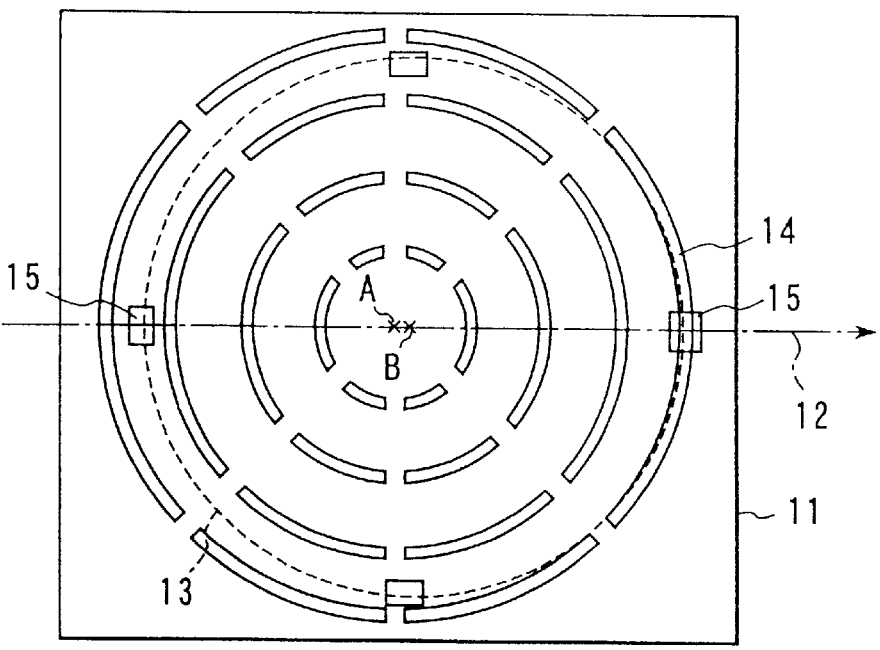
FIG. 6 is a view mainly showing another example of a heater structure of a device for heating a substrate.

The embodiment relates to a method to solve a problem of an acid diffusion reaction when a chemical amplified type resist is employed. In the embodiment, a heater having a structure as shown in FIG. 6 is used and the heater is mounted to a device as shown in FIG. 2.

Figure 12A:
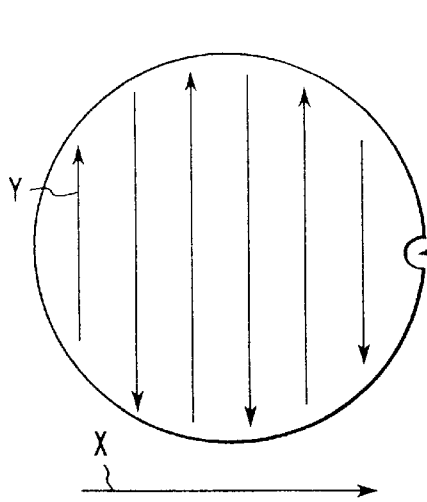
FIG. 12A is a view showing a transfer orientation on a to-be-treated substrate and FIG. 12B is a view showing an isothermal line on the to-be-treated substrate.

As a to-be-treated substrate, a silicon wafer, on which an anti-reflection film was formed, and which was further coated with a chemical amplified type resist on the anti-reflection film was used. A device pattern with a design rule of a half pitch 150 nm was transferred on such a to-be-treated substrate using a DUV exposure apparatus. The transfer as a whole was performed in the direction from the opposite side to a notch of the to-be-treated substrate to the notch side thereof as indicated by an arrow mark X of FIG. 12A. Actually, the transfer as a whole is performed in the X direction while reciprocating along the direction indicated by an arrow mark Y of FIG. 12A. However, the expression "the direction along which the to-be-transferred area is moved" recited in description of the present invention means the direction indicated by the arrow mark X. There arose a problem that, when a heat treatment was applied all over a substrate surface in a condition in which temperature was uniform across the substrate surface, a pattern size of a positive type resist after development was narrower in the opposite side to the notch by about 1% than in the notch side. This is because exposure is progressively performed starting from the opposite side to the notch, so that an acid diffusion reaction is more advanced in the opposite side to the notch than in the notch side.

Figure 12B:
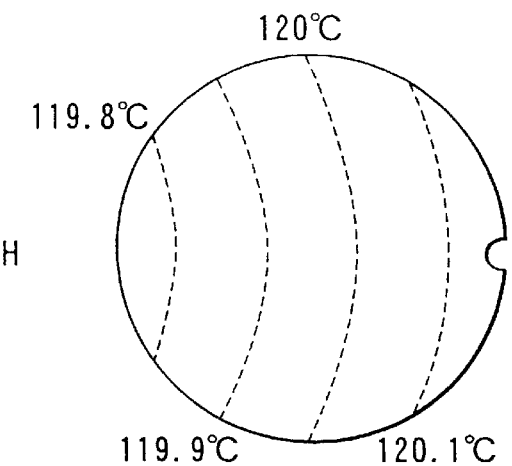
Figure 13A:
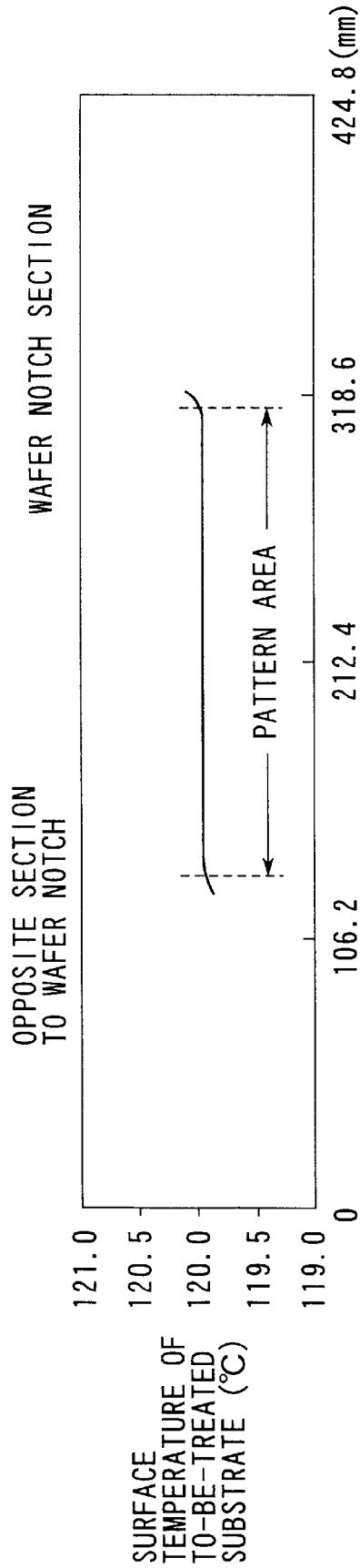
FIG. 13A is a graph showing a surface distribution of a surface temperature of a to-be-treated substrate and FIG. 13B is a graph showing a surface distribution of a surface temperature of a heat diffusion plate.

In order to solve such a problem, the opposite side to the notch of a to-be-treated substrate was arranged to be located in the upstream side of the heating device and in the condition in which a heat treatment was applied to the to-be-treated substrate at about 120° C. The temperature distribution in this case was adjusted as shown in FIG. 13A by controlling a gas stream. That is, a temperature at the substrate edge portion opposite to the notch was set at a temperature lower than at the center of the to-be-treated substrate by 0.2° C., while a temperature in the notch portion was set higher than at the center of the to-be-treated substrate by 0.2° C. An isothermal line on the to-be-treated substrate was observed as shown in FIG. 12B. A surface temperature of the substrate is given a gradient at which the surface temperature was gradually increased from the substrate edge portion opposite to the notch toward the notch portion, that is a temperature of the substrate was increased as it is later in the exposure order.

After the heat treatment was finished under the above mentioned conditions, the to-be-treated substrate was separated from the heat diffusion plate to cool. The cooling treatment is effected by increasing a gas steam speed compared with during the heat treatment or reducing a gas steam temperature. The to-be-treated substrate may be subjected to a cooling treatment, being placed on a cooling plate. Development was performed after the cooling with the result that a change in size of a resist pattern which would have been caused by an acid diffusion reaction could be corrected.

In the mean time, in order to attain a surface temperature distribution of a to-be-treated substrate as shown in FIG. 13A, it is required for a substrate temperature to be correctly measured. In a method in which a thermocouple or a platinum resistance thermometer is embedded in a heat diffusion plate as conventional, it is hard to attain a correct temperature distribution.

Figure 13B:
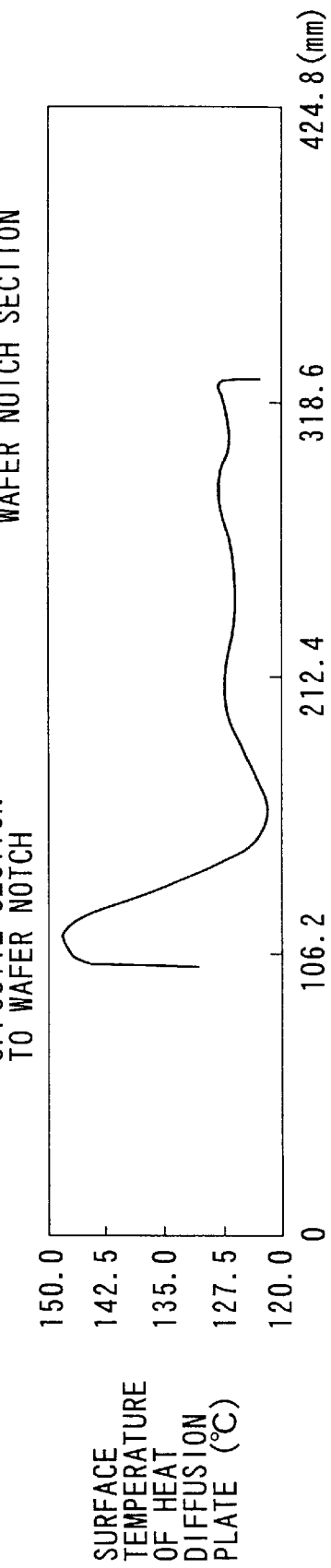

FIG. 13B shows a surface temperature distribution of a heat diffusion plate when a surface temperature of a to-betreated substrate is set as shown in FIG. 12. It is found that even if a surface temperature of the to-be-treated substrate is almost constant, a surface temperature of a heat diffusion plate is not uniform. A conventional control method has to set a temperature of a heat diffusion plate in a more finely segmented mode and when a gas stream is turbulent, no control can be performed. Therefore, in order to perform temperature control to high precision, it is required to correctly measure surface temperature of a to-be-treated substrate by a method shown in either FIG. 3 or 4.

In the mean time, in the embodiment, while a gas stream is controlled to flow toward a last exposure area from a first exposure area, it is alternatively allowed that a heat diffusion plate is made to have a temperature distribution thereof so that a temperature of a to-be-treated substrate is increased from the first exposure area to the last exposure area. That is, a temperature of the heat diffusion plate may be set so as to be gradually increased from the first exposure area toward the last exposure area.

(Embodiment 3)

FIGS. 14A and 14B are top views mainly showing arrangement in a heater of a device for heating according to the embodiment. For convenience in description, a pattern of the first heater constituting section is shown in FIG. 14A and a pattern of the second heater constituting section is shown in FIG. 14B. Actually, patterns of the first and second heater constituting sections are arranged in an overlapping manner, as shown in a sectional view of FIG. 15. Incidentally, the constituents corresponding to those of FIG. 1 and the like are indicated by the same marks.

A to-be-treated substrate (a silicon wafer is employed as the to-be-treated substrate) is fixed in a substrate placement area 13 on a heat diffusion plate 11 by a plurality of substrate holding pins 15. The heat diffusion plate 11 is made of a high heat conductivity material. In this case, the heat diffusion plate 11 is made of AlN (heat conductivity of 180W/msK) and has a thickness of 4 mm.

The second heater constituting section 14b ($14b_1$ to $14b_6$) is arranged for the purpose to improve an influence of a gas stream and a plurality of heater elements are arranged in a direction perpendicular to a gas stream 12. Heater elements of the second heater constituting section 14b are embedded in the bulk of the hear diffusion plate 11 in depth of 2 mm from the surface thereof and a thickness of each heater element is of the order of 100 $\mu$m.

The first heater constituting section 14a is provided for the purpose to treat the to-be-treated substrate (silicon wafer) of a circular shape and a plurality of heater elements thereof are arranged on concentric circles. The heater elements are located on the bottom surface of the heat diffusion plate 11.

A terminal of the second heater constituting section 14b is provided on the side surface of the heat diffusion plate 11. A terminal of the first heater constituting section 14a is provided in the downstream from the center of the placement area 13 for the to-be-treated substrate.

When the first heater constituting section 14a is embedded in the bulk of the heat diffusion plate 11, the heater pattern is required to be extended to the outside in order to connect the heater element inside to a terminal. Therefore, there arises a problem that an extended heater pattern increases its generated heat in a area where the pattern is formed. In the embodiment, in order to avoid such a problem, the first heater constituting section 14a is arranged on the bottom surface of the heat diffusion plate 11.

The number of heater elements on a circumference of the first heater constituting section 14a was further increased compared with that as shown in FIG. 14A and a heating device having a fundamental structure similar to FIG. 2 was constructed. A gas flowing in through a gas introductory port 17 shown in FIG. 2 was discharged from a gas exhaust port 18 and thereby, a laminar gas stream 12 was produced in a space above the to-be-treated substrate 16. A gas stream speed was 25 cm/sec.

A structure of the entire heating device in use comprises a fundamental structure as shown in FIG. 3. A fundamental control method and the like of the heating device are similar to a method described above.

As terminals for measurement of a surface temperature of the to-be-treated substrate, a measurement terminal group (a second terminal group) arranged so as to pass through the vicinity of the center of the to-be-treated substrate along a gas stream and a measurement terminal group (a first terminal group) arranged so as to pass through the vicinity of the center of the to-be-treated substrate perpendicularly to a gas stream were used. Information from the first terminal group was used for control of the first heater constituting section 14a and information from the second terminal group was used for control of the second heater constituting section 14b.

Adjustment of generated heat was effected by adjusting ON/OFF times of a switch connected each of the heater elements while a voltage and a current were fixed in magnitude.

More of heat is taken away from a to-be-treated substrate in the upstream side than in the downstream side under a influence of a gas stream. Therefore, in the second heater constituting section 14b, generated heat is preferably adjusted so as to be larger in the upstream side than in the downstream side.

A concrete example when a to-be-treated substrate is subjected to a heat treatment using the device of the embodiment will then be described.

As a to-be-treated substrate, a silicon wafer, on which an anti-reflection film was formed, and which was further coated with a chemical amplified type resist on the anti-reflection film was used. A device pattern with a design rule of a half pitch 150 nm was transferred on such a to-be-treated substrate using a DUV exposure apparatus. After transfer of the device pattern, the to-be-treated substrate was subjected to a heat treatment at a set temperature of 120° C. using the device of the embodiment.

A change in surface temperature with time when the to-be-treated substrate of a surface temperature of 25° C. is placed on the heat diffusion plate is similar to that as shown in FIG. 5. The to-be-treated substrate reached to the set temperature after 20 seconds passed and thereafter was kept in a stationary state. A variation of a time required to reach the set temperature of 120° C. was within 1 second even for the entire to-be-treated substrate and heating uniformity in the stationary state could be secured within 120° C.±0.1° C.

After the heat treatment for 90 seconds, the to-be-treated substrate was raised by a substrate vertical movement pins to incline the to-be-treated substrate in such a manner that the upstream side was closer to the heat diffusion plate than the downstream side. The to-be-treated substrate was inclined so as to be along a boundary layer in the upstream side. Further, a gas stream speed was raised to be 70 cm/sec.

By such a method in use, a surface temperature of the substrate could be reduced to 50° C. in a uniform manner all over the entire substrate surface. It took 15 seconds for a surface temperature of the substrate to be reduced to 50° C. Further, since the substrate was inclined so that the downstream side is away from the heat diffusion plate, reduction in temperature by a gas stream could be restricted to the minimum.

Thereafter, a gas stream speed was restored to 25 cm/sec, the substrate was adjusted to be horizontal and then, the substrate was transported out. After a substrate temperature was cooled to room temperature, development was carried out to form a resist pattern. While a distribution of a resist pattern size which was obtainable when a conventional heating device was employed had been of the order of 7%, a distribution of a resist pattern size was of the order of 3.5% by use of the device of the embodiment. In the mean time, since a variation caused by development of 3% is included, a distribution of a resist pattern size is actually improved to 1.8% from a conventional 6.3% by use of the device of the embodiment.

By use of the heating device of the present invention, controllability of a line width in a device was drastically able to be improved. Since controllability of a processing size was improved compared with when a conventional heating device was used, a variation of a resistance was also greatly improved.

In the mean time, a plan arrangement of heater elements of the first heater constituting section and a positional relationship between the heater and the substrate placement area may be those as in FIGS. 1 and 6 to 8. Further, a method for dividing a heater, the number of divided parts and the like can be modified or changed in various manners according to a gas stream speed distribution or the like.

Heater lines constituting respective heater elements may be those as shown in FIG. 11 as in the case of the first embodiment.

In the above mentioned embodiments, as a gas stream introductory port, as shown in FIG. 16, a gas stream introductory port 17b to introduce a gas stream of a high temperature than room temperature may be provided in addition to a gas stream introductory port 17a to introduce a gas stream of room temperature. In the device shown in FIG. 16, either of the gas stream introductory port 17a and the gas stream introductory port 17b can be selected by a valve. When a high temperature gas stream is introduced in heating a to-be-treated substrate, a degree of heating uniformity can be further improved.

Incidentally, while in the above mentioned embodiments, a heat diffusion plate of a tetragon as viewed from above is used, a heat diffusion plate of a circle or an ellipse can be used. Further, a shape of the first heater constituting section which is arranged in a ring-like shape can be of a circle, of an arc and in addition, for example, of a tetragon. Further, as a to-be-treatment substrate, in addition to a silicon wafer, a reticle, a mask substrate, a liquid crystal panel or the like can be used.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A device for heating a substrate comprising:
   a heating plate for heating a to-be-treated substrate;
   a substrate holding section for holding the to-be-treated substrate on the heating plate;
   a gas stream producing section for producing a gas stream in a space above the heating plate in one direction along a surface of the heating plate, the gas stream producing section including a gas introduction port and a gas exhaust port located opposite to the gas introduction port as referenced to the heating plate; and
   a heater provided at the heating plate,
   said heater including a plurality of heater elements which are arranged symmetrically with respect to an axis defined by a gas stream flowing through a center of the heating plate said heater elements being arranged in a plurality of ring regions such that each of the ring regions includes at least two of the heater elements.

2. A device for heating a substrate according to claim 1, wherein the substrate holding section has a plurality of holding portions constituted so that the center of the plurality of holding portions is shifted from the center of said plurality of ring regions toward said gas exhaust port.

3. A device for heating a substrate according to claim 1, further comprising at least three pins for moving the to-be-treated substrate in a vertical direction, wherein the pins are arranged symmetrically with respect to a gas stream flowing through the center of the heating plate.

4. A device for heating a substrate comprising:
   a heating plate for heating a to-be-treated substrate;
   a substrate holding section for holding the to-be-treated substrate on the heating plate;
   a gas stream producing section for producing a gas stream in a space above the heating plate in one direction along a surface of the heating plate, the gas stream producing section including a gas introduction port and a gas exhaust port located opposite to the gas introduction port as referenced to the heating plate; and
   a heater provided at the heating plate,
   said heater including a plurality of heater elements arranged symmetrically with respect to a first axis defined by a gas stream flowing through a center of the heating plate and which are arranged asymmetrically with respect to a second axis orthogonal to the gas stream flowing through the center of the heating plate.

5. A device for heating a substrate according to claim 4, further comprising at least three pins for moving the to-be-treated substrate in a vertical direction, wherein the pins are arranged symmetrically with respect to a gas stream flowing through the center of the heating plate.

6. A method for treating a substrate comprising the steps of:
   sequentially exposing a plurality of areas of a photosensitive film formed on a to-be-treated substrate, and sequentially transferring a plurality of patterns onto the plurality of areas of the photosensitive film, the to-be-treated substrate being moved step by step when said plurality of areas are exposed;
   holding the to-be-treated substrate on a heating plate; and
   heating the to-be-treated substrate held on the heating plate such that a temperature of the to-be-treated substrate increases from an area that is firstly exposed to an area that is lastly exposed.

7. A method for treating a substrate according to claim 6, wherein said heating step is performed by heating the heating plate and producing a gas stream in a space above the substrate such that the gas stream flows from the area firstly exposed to the area lastly exposed.

8. A method for treating a substrate according to claim 6, wherein said heating step is performed by heating the heating plate such that a temperature of the heating plate increase from the area firstly exposed to the area lastly exposed.

9. A method for heating a substrate by using a substrate heating device, said substrate heating device including:
a heating plate for heating a to-be-treated substrate;
a substrate holding section for holding the to-be-treated substrate on the heating plate;
a gas stream producing section for producing a gas stream in a space above the heating plate in one direction along a surface of the heating plate, the gas stream producing section including a gas stream introduction port, and a gas exhaust port which is located opposite to the gas introduction port as referenced to heating plate; and
a heater provided at the heating plate, the heater having a plurality of heater elements,
wherein said plurality of heater elements are controlled such that a temperature distribution of the heating plate is symmetrical with respect to a first axis defined by a gas stream flowing through a center of the heating plate and is asymmetrical with respect to a second axis orthogonal to the gas stream flowing through the center of the heating plate.

10. A method for heating a substrate according to claim 9, wherein said heater elements are arranged symmetrically with respect to the first axis defined by the gas stream flowing through the center of the heating plate, and said heater elements are arranged in a plurality of ring regions such that each of the ring regions includes at least two of the heater elements.

11. A method for heating a substrate according to claim 9, wherein said plurality of heater elements are arranged symmetrically with respect to the first axis defined by the gas stream flowing through the center of the heating plate, and are arranged asymmetrically with respect to a second axis orthogonal to the gas stream flowing through the center of the heating plate.

12. A method for heating a substrate according to claim 9, wherein heat generated by the heater is controlled by a temperature control section based on a measurement result of a temperature measurement section disposed in a space above the to-be-treated substrate, wherein the temperature measurement section includes:
a light-illumination section which illuminates a surface of the to-be-treated substrate; and
a reaction amount measurement section in which a change in reflectance due to a change in film thickness or in absorbance of a surface layer of the to-be-treated substrate is obtained by measuring an intensity of reflecting light from the surface of the to-be-treated substrate and a reaction amount of the surface layer is obtained based on the change in reflectance, and
the temperature control section controls heat generated by the heater so that the reaction amount obtained in the reaction amount measurement section becomes a predetermined amount.

13. A method for heating a substrate according to claim 9, wherein a temperature of the heating plate which is heated by the heater is controlled so that the temperature of the heating plate is a predetermined temperature higher than a treatment temperature of the to-be-treated substrate before the to-be-treated substrate is placed on the heating plate and so that the temperature of the heating plate is lower than the predetermined temperature after the to-be-treated substrate is placed on the heating plate.

14. A method for heating a substrate according to claim 13, wherein heat generated by the heater is controlled by a temperature control section based on a measurement result of a temperature measurement section disposed in a space above the to-be-treated substrate, wherein the temperature measurement section includes:
a light illumination section which illuminates a surface of the to-be-treated substrate; and
a reaction amount measurement section in which a change in reflectance due to a change in film thickness or in absorbance of a surface layer of the to-be-treated substrate is obtained by measuring an intensity of reflecting light from the surface of the to-be-treated substrate and a reaction amount of the surface layer is obtained based on the change in reflectance, and
the temperature control section controls heat generated by the heater so that the reaction amount obtained in the reaction amount measurement section becomes a predetermined amount.

15. A method for heating a substrate according to claim 9, wherein after the to-be-treated substrate held on the heating plate is heated by the heater, the to-be-treated substrate is raised and kept in an inclined state.

* * * * *

UNITED STATES PATENT AND TRADEMARK OFFICE
CERTIFICATE OF CORRECTION

PATENT NO. : 6,072,162
DATED : June 6, 2000
INVENTOR(S) : Shinichi Ito, et. al.

It is certified that error appears in the above-identified patent and that said Letters Patent is hereby corrected as shown below:

Claim 1, Col. 14, line 5, after "plate", insert --,--.

Claim 8, Col. 14, line 66, "increase" should read --increases--.

Claim 9, Col. 15, line 13, before "heating plate", insert --the--.

Signed and Sealed this

Twenty-second Day of May, 2001

Attest:

NICHOLAS P. GODICI

Attesting Officer     Acting Director of the United States Patent and Trademark Office